United States Patent
Lagoguez et al.

(10) Patent No.: US 6,842,127 B2
(45) Date of Patent: Jan. 11, 2005

(54) CLOSED-LOOP CONTROL OF AN ANALOG SYSTEM PROVIDING AN OUTPUT SIGNAL WITH A CONTROL SIGNAL

(75) Inventors: Bruno Lagoguez, Claix (FR); Gabriel Della-Monica, Moirans (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/649,117

(22) Filed: Aug. 27, 2003

(65) Prior Publication Data

US 2004/0041720 A1 Mar. 4, 2004

(30) Foreign Application Priority Data

Aug. 29, 2002 (FR) .............................. 02 10721

(51) Int. Cl.[7] .............................................. H03M 1/00
(52) U.S. Cl. ...................... 341/126; 341/144; 341/155
(58) Field of Search ........................ 341/118–121, 144, 341/145, 155, 156, 110, 126

(56) References Cited

U.S. PATENT DOCUMENTS 5,278,994 A * 1/1994 Black et al. ................ 455/126
5,566,363 A    10/1996 Senda
5,732,334 A *  3/1998 Miyake ...................... 455/126
6,020,787 A    2/2000 Kim et al.
6,057,732 A *  5/2000 Morishita ................... 330/129

FOREIGN PATENT DOCUMENTS

WO    WO 01 58013 A    8/2001

OTHER PUBLICATIONS

French Search Report from French Patent Application 02/10721, filed Aug. 29, 2002.

* cited by examiner

Primary Examiner—Brian Young
Assistant Examiner—John B Nguyen
(74) Attorney, Agent, or Firm—Lisa K. Jorgenson; James H. Morris; Wolf, Greenfield & Sacks, P.C.

(57) ABSTRACT

A method for controlling in closed loop an analog system generating an output signal from a control signal, wherein the control signal is a series of digital values, each new digital value being determined based on the difference between a signal linked to the output signal and the last determined value of the control signal multiplied by a selected factor. The present invention also relates to a device for controlling an analog system generating an analog output signal.

46 Claims, 2 Drawing Sheets

US 6,842,127 B2

CLOSED-LOOP CONTROL OF AN ANALOG SYSTEM PROVIDING AN OUTPUT SIGNAL WITH A CONTROL SIGNAL

BACKGROUND OF THE INVENTION

1. Field of the Invention

The present invention relates to a method and a device for controlling an analog system providing an output signal with a control signal.

2. Discussion of the Related Art

An application of the present invention relates to the control of a signal amplifier of a portable phone transmission system.

FIG. 1 shows in the form of a block diagram a conventional architecture of a portable phone transmission system 10.

Transmission system 10 comprises an amplifier 12 (AMPLI) receiving an analog signal S comprising the information to be transmitted corresponding, for example, to a modulated voltage. Amplifier 12 transmits an amplified analog signal S' to an antenna 14 (ANTEN).

Transmit system 10 generally receives a digital reference $P_{REF}$ generally transmitted to the portable phone by a distant terminal and for example corresponding to a determined power value at which signal S' is to be transmitted.

Amplifier 12 is driven by an analog control signal $V_C$ which corresponds to the conversion by a digital-to-analog converter 16 (DAC) of a digital control signal $N_C$ provided by a calculator 18 (F). Calculator 18 receives signal $P_{REF}$ and has access to a memory (not shown) in which is stored a control table indicating theoretical values of the control signal for the power values aimed at.

In practice, the power of signal S' may differ from the theoretical power according to certain parameters such as the operating temperature of amplifier 12, the portable phone supply voltage, or other external parameters. It is thus necessary to correct the theoretical control signal. This is currently performed by a closed-loop control of the power of signal S' provided by amplifier 12.

A sensor 20 provides based on signal S' an analog detection signal $V_D$ to the non-inverting input of a comparator 22 (COMP). Signal $V_D$ may correspond to a voltage equal to the peak value of signal S' or to the average value of signal S'. A generator 24 (GEN) provides a reference signal $V_{REF}$, generally a constant voltage, to the inverting input of comparator 22 which transmits to an analog-to-digital converter 26 (ADC) a modified detection analog signal $V'_D$ corresponding to the difference between signal $V_D$ and reference signal $V_{REF}$. Converter 26 converts signal $V'_D$ into a digital detection signal $N'_D$ transmitted to calculator 18. Calculator 18 also has access to a memory (not shown) where is stored a detection table indicating for given values of signal $N'_D$ the corresponding values of the power of signal S'. Signal $N_C$ is provided by calculator 18, which corrects the above-mentioned theoretical value by the indication provided by the detection table.

In FIG. 2, curves 30 and 32 represent, for given operating conditions of the amplifier, voltages $V_C$ and $V_D$ according to power $P_{OUT}$ of signal S' expressed in dBm. Power $P_{OUT}$ thus is equal to 10 logP, where P is the power of signal S' expressed in milliwatts. More specifically, curve 30 represents the real relation, for the given operating conditions, between voltage $V_C$ and power $P_{OUT}$ of signal S' really provided by amplifier 12 upon reception of signal $V_C$.

The regulation of the power of output signal S' is performed as follows. Based on power reference $P_{REF}$, calculator 18 determines a first value, or theoretical value, of digital control signal $N_C$ based on the control table. The value of signal $V_C$ is that for which the amplifier should theoretically provide a signal S' of power $P_{REF}$. Based on signal $N'_D$, calculator 18 determines the power really provided by amplifier 12 and accordingly increases or decreases the value of signal $N_C$.

As appears in FIG. 2, signal $V_D$ can vary between two positive values $V_{MIN}$ and $V_{MAX}$. Signal $V_{REF}$ is generally taken to be equal to $V_{MIN}$. Signal $V'_D$ can thus vary between 0 and $V_{MAX}-V_{MIN}$. The maximum value of $V'_D$ ($V_{MAX}-V_{MIN}$) is thus smaller than the maximum value of $V_D$ ($V_{MAX}$). Signal $V'_D$ can thus be coded by a smaller number of bits than signal $V_D$ and converter 26 can be simplified.

The number of bits of converter 26 is also a function of the accuracy with which the power of signal S' is desired to be controlled. In the present example, the power amplitude is 74 dBm. If the accuracy desired for the power control of output signal S' is 0.2 dB, calculator 18 must be able to provide 370 distinct values of $N_C$. Considering that the relation between $V'_D$ and power $P_{OUT}$ is substantially linear and that to each value of $V'_D$ between 0 and $V_{MAX}-V_{MIN}$ corresponds a power value, this amounts to saying that converter 26 must be able to code 370 different values for signal $N'_D$. A coding over 9 bits enables coding 512 different values of voltage $V'_D$. The amplitude of voltage $V'_D$ being of 1260 millivolts, the accuracy obtained for the coding of voltage $V'_D$ is approximately 2.5 millivolts. To obtain a coding of same accuracy for signal $V_D$ which has an amplitude of 2187 mV, a coding over 10 bits will be necessary.

As mobile telephony standards vary, the accuracy required for the power control of the output signal tends to increase. It will then be necessary to increase the number of bits used by analog-to-digital converter 26 to code a greater number of different values of voltage $V'_D$.

This results in an increase of the cost of analog-to-digital converter 26 which is hardly compatible with the cost constraints specific to mobile telephony. Further, according to the required accuracy, the technological limits of the analog-to-digital converters used in mobile telephony and which enable coding to approximately 14 bits may be reached.

SUMMARY OF THE INVENTION

The present provides a method for controlling in closed loop an analog system generating an output signal with a control signal.

To achieve this and other objects, the present invention provides a method for controlling, in closed loop, an analog system generating an output signal from a control signal in which the control signal is a series of digital values, each new digital value being determined based on the difference between a signal linked to the output signal and the last determined value of the control signal multiplied by a selected factor.

According to an embodiment of the present invention, the analog system generates an analog output signal and is controlled by an analog control signal corresponding to the conversion of the digital control signal, said digital control signal being provided by a digital system which generates successive values of the digital control signal based on a reference signal and on a digital detection signal corresponding to the conversion of an analog detection signal, a new value of the digital control signal being determined according to the steps of measuring an analog signal representative of the analog output signal; determining the analog detection signal based on the difference between the representative analog signal and the analog control signal multiplied by the selected factor; converting the analog detection signal into a new digital detection signal value; and calculating the new value of the digital control signal based on said new value of the digital detection signal and on the last previously-determined value of the digital control signal.

According to an embodiment of the present invention, the representative analog signal and the analog control signal have the same sign, the analog detection signal corresponding to the difference between the representative analog signal and the analog control signal multiplied by an amplification coefficient.

According to an embodiment of the present invention, the analog output signal is a variable voltage.

According to an embodiment of the present invention, the analog representative signal is a positive voltage substantially equal to the maximum value of the analog output signal.

According to an embodiment of the present invention, the reference signal is representative of the desired power of the analog output signal.

According to an embodiment of the present invention, the amplification coefficient is constant.

According to an embodiment of the present invention, the amplification coefficient depends on the operating conditions of the digital system.

The present invention also provides a device for controlling an analog system providing an analog output signal comprising a digital system providing a digital control signal; a digital-to-analog converter receiving the digital control signal and providing an analog control signal to the analog system; and a sensor measuring an analog signal representative of the analog output signal, further comprising a comparator providing an analog detection signal based on the representative analog signal and on the analog control signal; and an analog-to-digital converter converting the analog detection signal into a digital detection signal provided to the digital system, said digital system determining the digital control signal based on a reference signal and on the digital detection signal.

According to an embodiment of the present invention, the analog system is an amplifier of signals of a portable phone.

The foregoing objects, features and advantages of the present invention, will be discussed in detail in the following non-limiting description of specific embodiments in connection with the accompanying drawings.

DETAILED DESCRIPTION

Figure 1:
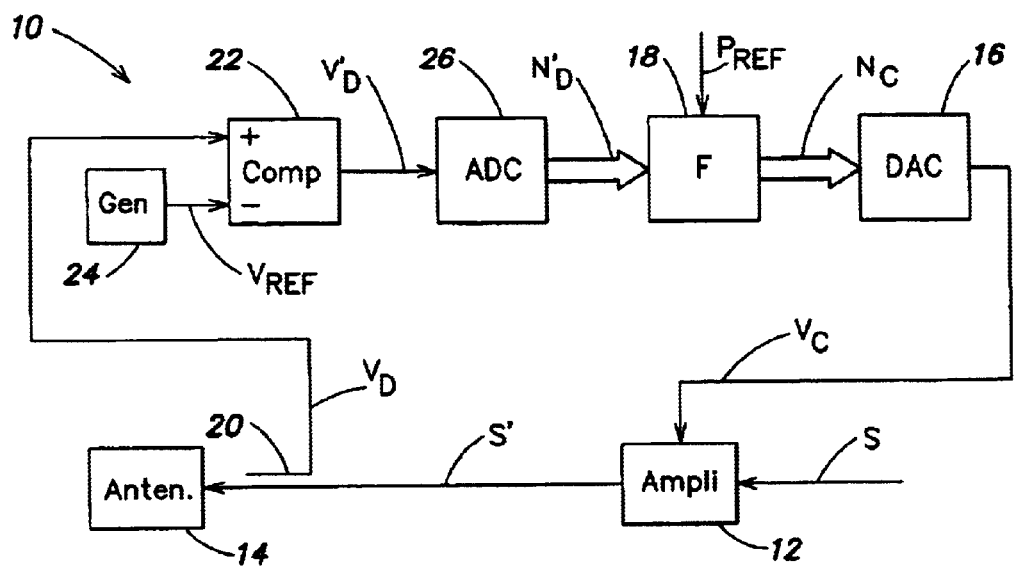
FIG. 1, previously described, shows in the form of a block diagram a conventional architecture of a portable phone transmission system.

Transmission system 40 according to the present invention comprises, identically to system 10 of FIG. 1, an amplifier 12 (AMPLI) receiving an analog signal S and providing an amplified analog output signal S' to an antenna 14 (ANTEN) and a sensor 20 measuring an analog signal $V_D$ which is a function of signal S'.

A digital calculator 42 (F') receives a power reference $P_{REF}$ and provides a digital control signal $N_C$ to a digital-to-analog converter 16 which converts it into an analog control signal $V_C$ transmitted to amplifier 12. Signal $V_C$ also supplies an auxiliary amplifier 44 (*K) which amplifies by a coefficient K the value of analog signal $V_C$ and transmits the amplified signal to the inverting input of a comparator 46. The non-inverting input of comparator 46 receives analog signal $V_D$ measured by sensor 20. Comparator 46 provides a modified analog detection signal $V''_D = V_D - KV_C$ to an analog-to-digital converter 47 which converts signal $V''_D$ into a digital signal $N''_D$ transmitted to calculator 42. Calculator 42 has access to control and detection tables such as mentioned previously.

Figure 2:
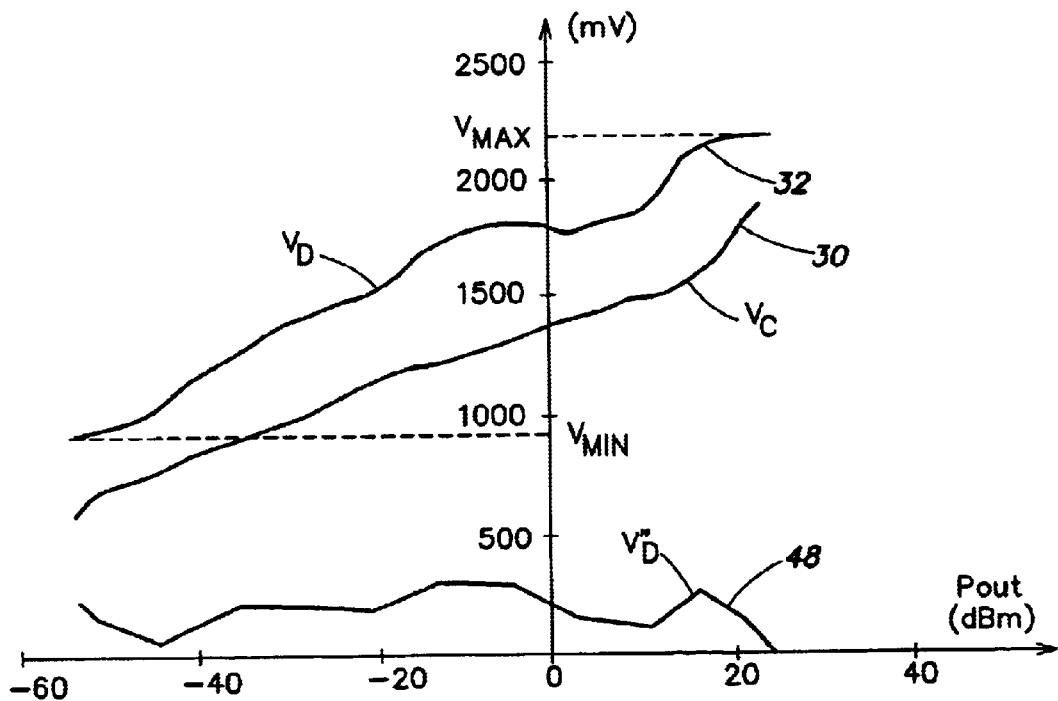
FIG. 2, partly previously described, shows examples of curves of signals characteristic of the transmission system of FIG. 1 according to the power of the signal to be transmitted.
Figure 3:
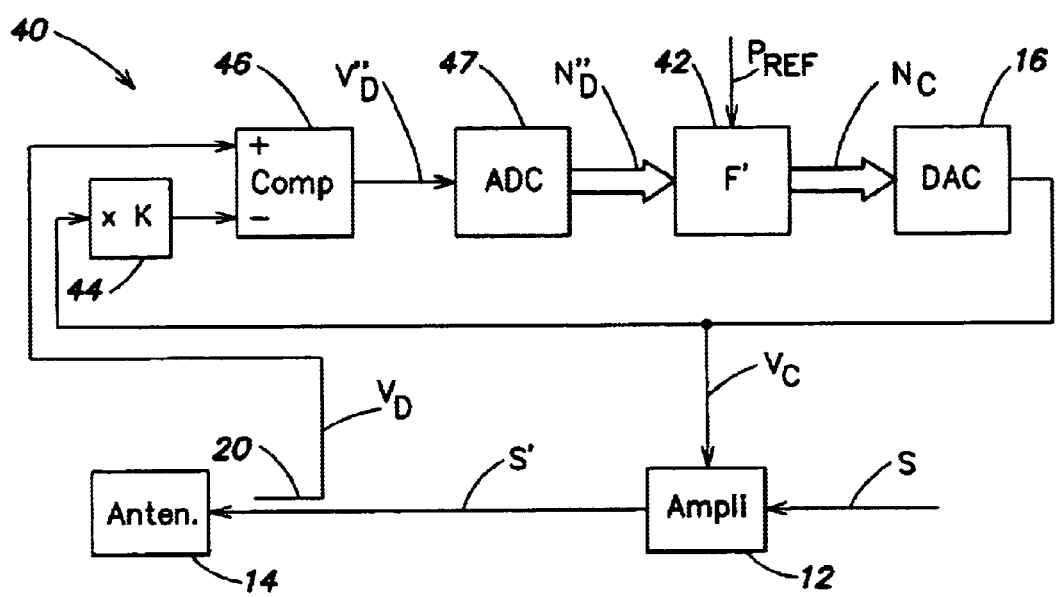
FIG. 3 shows in the form of a block diagram an example of embodiment of a transmission system according to the present invention.

In FIG. 2, curve 48 shows signal $V''_D$ according to power $P_{OUT}$ expressed in dBm of output signal S'. Coefficient K may be an empirically-determined constant so that signal $V''_D$ is positive for all of the possible values of $P_{OUT}$ while having the smallest possible amplitude. In FIG. 2, coefficient K has been set to 1.15.

The calculation of the digital values of digital signal $N_C$ by calculator 42 is performed according to the following steps.

Initially, upon reception of a power reference signal $P_{REF}$, calculator 42 transmits a first digital control signal value $N_C$ which is converted by converter 16 into an analog control signal $V_C$ transmitted to amplifier 12. Amplifier 12 accordingly generates an amplified signal S' at a given power and sensor 20 measures analog detection signal $V_D$. Converter 47 receives from comparator 46 analog signal $V''_D$ and converts it into digital signal $N''_D$.

Upon reception of digital signal $N''_D$, calculator 42 determines a digital value $N'_D$ which corresponds to the digital value which would originate from the conversion of signal $V'_D$ previously mentioned in relation with FIG. 1. The calculation is performed based on digital value $N''_D$, on the value of the previously-calculated digital control signal $N_C$ and on the coefficient K known by calculator 42. Based on the calculated digital value $N'_D$, calculator 42 determines by means of the detection table the power really provided by amplifier 12 and compares it with reference $P_{REF}$. According to the result of the comparison, calculator 42 determines a new digital value of digital control signal $N_C$.

The relation between signals $V''_D$, $V_D$, and $V_C$ is linear. Thereby, to calculate digital value $N'_D$, it is sufficient to have, for the coding of signal $V''_D$, an accuracy identical to that which was required for signal $V'_D$. Now, since the amplitude of analog signal $V''_D$ is lower than that of signals $V_D$ and $V'_D$, the number of necessary bits to code signal $V''_D$ for a same coding accuracy will be smaller than that of a conventional transmission system. In the example of FIG. 2, analog signal $V''_D$ exhibits a maximum amplitude of 303 millivolts. To obtain an accuracy of 0.2 dB on the power control, an accuracy of 2.5 mV for the coding of signal $V''_D$ is needed. It must thus be possible to code 122 states of $V''_D$. A coding over 7 bits is then sufficient.

According to an alternative of the present invention, coefficient K may be variable according to the operating conditions of amplifier 12. In particular, coefficient K may be a function of the operating temperature of amplifier 12 or of the charge state of batteries supplying amplifier 12.

According to another alternative of the present invention, in the case where the relation between voltage $V_D$ and power $P_{OUT}$ expressed in dBm cannot be considered as a linear relation, the number of states to be coded for signal $V''_D$ may be multiplied by a correction factor which is a function of the maximum slope of the curve representative of signal $V_D$ according to $P_{OUT}$.

The present invention enables reducing the number of bits of analog-to-digital converter 47. It is thus possible to keep a low-cost converter while increasing the accuracy of the power control of output signal S'.

Further, the elements necessary to implement the method, that is, auxiliary amplifier 44 and comparator 46, may be easily formed on integrated circuits.

Of course, the present invention is likely to have various alterations, modifications, and improvement which will readily occur to those skilled in the art. In particular, the present invention may be applied to any closed-loop control process of an analog system by a digital system in which the digital system provides a control signal to the analog system and receives a detection signal which is a function of the output of the analog system. For example, it may be a regulation system of the heating of an apartment. In this case, the analog system may correspond to the central heater heating water which flows through radiators arranged in the apartment. The reference may be the desired apartment temperature and the detection signal may correspond to the temperature of the heated water, or to the temperature of the room to be heated.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for controlling in closed loop an analog system generating an output signal from a control signal, wherein the control signal is a series of digital values, each new digital value being determined from a difference between a signal linked to the output signal and a last determined value of the control signal multiplied by a selected factor.

2. The control method of claim 1, wherein the analog system generates an analog output signal and is controlled by an analog control signal corresponding to a conversion of the digital control signal, said digital control signal being provided by a digital system which generates successive values of the digital control signal based on a reference signal and on a digital detection signal corresponding to a conversion of an analog detection signal, a new value of the digital control signal being determined according to the steps of:

measuring an analog signal representative of the analog output signal;

determining the analog detection signal based on a difference between the representative analog signal and the analog control signal multiplied by the selected factor;

converting the analog detection signal into a new digital detection signal value; and calculating the new value of the digital control signal based on said new value of the digital detection signal and on a last previously-determined value of the digital control signal.

3. The method of claim 2, wherein the representative analog signal and the analog control signal have a same sign, the analog detection signal corresponding to a difference between the representative analog signal and the analog control signal multiplied by an amplification coefficient.

4. The method of claim 1, wherein the analog output signal is a variable voltage.

5. The method of claim 2, wherein the representative analog signal is a positive voltage substantially equal to a maximum value of the analog output signal.

6. The method of claim 2, wherein the reference signal is representative of a desired power of the analog output signal.

7. The method of claim 3, wherein the amplification coefficient is constant.

8. The method of claim 3, wherein the amplification coefficient depends on the operating conditions of the digital system.

9. A device for controlling an analog system providing an analog output signal, comprising:

a digital system providing a digital control signal;

a digital-to-analog converter receiving the digital control signal and providing an analog control signal to the analog system;

a sensor measuring an analog signal representative of the analog output signal;

a comparator providing an analog detection signal based on the representative analog signal and on the analog control signal; and an analog-to-digital converter converting the analog detection signal into a digital detection signal provided to the digital system, said digital system determining the digital control signal based on a reference signal and on the digital detection signal.

10. The device of claim 9, wherein the analog system is an amplifier of signals of a portable telephone.

11. The device of claim 9, wherein the comparator is operative to compare the representative analog signal and the analog control signal multiplied by a value, wherein the analog detection signal is based on a result of the comparison.

12. The device of claim 11, wherein the value by which the analog control signal is multiplied is a constant.

13. The device of claim 11, wherein the value by which the analog control signal is multiplied depends on operating conditions of the analog system.

14. The device of claim 11, wherein the comparator is operative to determine a difference between the representative analog signal and the analog control signal multiplied by the value, wherein the analog detection signal is based on the determined difference.

15. The device of claim 9, wherein the analog output signal is a variable voltage.

16. The device of claim 9, wherein the representative analog signal is a positive voltage substantially equal to a maximum value of the analog output signal.

17. The device of claim 9, wherein the representative analog signal is a voltage substantially equal to an average value of the analog output signal.

18. The device of claim 9, wherein the reference signal is representative of a desired power of the analog output signal.

19. The method of claim 2, wherein the representative analog signal is a voltage substantially equal to an average value of the analog output signal.

20. A method of controlling a system that generates an output signal, the method comprising acts of:

(A) controlling a value of the output signal, at least in part, with a control signal;

(B) multiplying a last-determined value of the control signal by a factor to produce a product;

(C) comparing a value of the product to a value of a signal representative of the output signal; and (D) generating a new value of the control signal based on the comparison.

21. The method of claim 20, further comprising an act of:

(D) detecting the representative signal.

22. The method of claim 20, wherein the act (B) comprises multiplying the last-determined value by a constant factor.

23. The method of claim 20, wherein the act (B) comprises multiplying the last-determined value by a factor that depends on operating conditions of the system.

24. The method of claim 20, wherein the act (C) comprises determining a difference between the value of the representative signal and the value of the product, and wherein act (D) comprises generating the new value based on the difference.

25. The method of claim 20, wherein the output signal is an analog output signal.

26. The method of claim 20, wherein the representative signal has a positive voltage substantially equal to a maximum value of the output signal.

27. The method of claim 20, wherein the representative signal has a voltage substantially equal to an average value of the output signal.

28. The method of claim 20, wherein the act (D) comprises generating a new value of the control signal based on the comparison and a reference value.

29. The method of claim 28, wherein the reference signal is representative of a desired power of the output signal.

30. The method of claim 20, wherein the act (C) comprises producing an analog result, wherein the method further comprises an act of:

(E) converting the analog result to a digital value, and wherein the act (D) comprises generating the new value based on the digital value.

31. The method of claim 20, wherein the system is an analog system.

32. The method of claim 31, wherein the analog system comprises an amplifier of signals of a portable telephone.

33. An apparatus for controlling a system that provides an output signal, the apparatus comprising:

a controller to generate a control signal that controls, at least in part, a value of the output signal;

a multiplication component to multiply a last-determined value of the control signal by a factor to produce a product; and a comparator to compare a value of the product to a value of a signal representative of the output signal, wherein the controller is operative to generate a new value of the control signal based on the comparison.

34. The apparatus of claim 33, further comprising;

a sensor to detect the representative signal.

35. The apparatus of claim 33, wherein, the multiplication component is an amplifier.

36. The apparatus of claim 34, wherein the system is an analog system.

37. The apparatus of claim 36, wherein the analog system comprises an amplifier of signals of a portable telephone.

38. The apparatus of claim 33, wherein the factor is a constant.

39. The apparatus of claim 33, wherein a value of the factor depends on operating conditions of the system.

40. The apparatus of claim 33, wherein the comparator is operative to determine a difference between the value of the product and the value of the representative signal, wherein the controller is operative to generate the new value based on the difference.

41. The apparatus of claim 33, wherein the output signal is a variable voltage.

42. The apparatus of claim 33, wherein the representative signal has a positive voltage substantially equal to a maximum value of the output signal.

43. The apparatus of claim 33, wherein the representative signal has a voltage substantially equal to an average value of the output signal.

44. The apparatus of claim 33, wherein the controller is operative to generate the new value based on the comparison and a reference signal.

45. The apparatus of claim 44, wherein the reference signal is representative of a desired power of the output signal.

46. The apparatus of claim 33, wherein the comparator is operative to generate an analog result, the apparatus further comprising:

an analog-to-digital converter to convert the analog result to a digital value, and wherein the controller is operative to generate the new value based on the digital value.

* * * * *